United States Patent [19]

Sample et al.

[11] E Re. 30,806

[45] Reissued Nov. 24, 1981

[54] LIGHT DEFLECTION APPARATUS

[75] Inventors: Winfield Sample, Sierra Madre; Robert L. Cheney, Arcadia, both of Calif.

[73] Assignee: Bell & Howell Company, Chicago, Ill.

[21] Appl. No.: 15,099

[22] Filed: Feb. 26, 1979

Related U.S. Patent Documents

Reissue of:

[64] Patent No.: 4,012,694
Issued: Mar. 15, 1977
Appl. No.: 628,159
Filed: Nov. 3, 1975

[51] Int. Cl.[3] ..... G01R 13/38

[52] U.S. Cl. ..... 324/97

[58] Field of Search ..... 324/97; 346/109; 250/230

[56] References Cited

U.S. PATENT DOCUMENTS

| | | | |
|---|---|---|---|
| 2,149,442 | 3/1939 | Kennenstine | 324/97 |
| 2,161,744 | 6/1939 | McCarty . | |
| 2,469,265 | 5/1949 | Hathaway . | |
| 2,599,661 | 6/1952 | Richardson . | |
| 2,692,178 | 10/1954 | Grandadam | 346/109 X |
| 2,845,615 | 7/1958 | Bowman | 346/109 X |
| 2,873,429 | 2/1959 | Atchley et al. | 324/97 X |
| 2,882,498 | 4/1959 | Turre . | |
| 3,161,826 | 12/1964 | Picard | 324/97 |
| 3,404,342 | 10/1968 | Allen, Jr. | 324/97 X |
| 3,821,749 | 6/1974 | Andreev et al. | 324/97 X |

FOREIGN PATENT DOCUMENTS

| | | |
|---|---|---|
| 40275 | 2/1932 | France . |
| 946478 | 1/1964 | United Kingdom . |

*Primary Examiner*—Stanley T. Krawczewicz
*Attorney, Agent, or Firm*—Benoit Law Corporation

[57] ABSTRACT

A deflection apparatus deflects a light beam in accordance with the characteristics of energizing signals to provide a trace of those signal characteristics on a display medium. The assembly includes a plurality of suspension galvanometers each having a coil responsive to an associated one of the signals to deflect a mirror positioned in the path of the light beam which in turn deflects the light beam. The galvanometers are suspended on a rigid supporting structure which is self-aligning. Pole pieces have a plurality of teeth which define secondary air gaps and provide a substantially constant, concentrated flux field for each of the coils. A printed circuit board cooperates with cover members to form a dust free enclosure.

18 Claims, 11 Drawing Figures

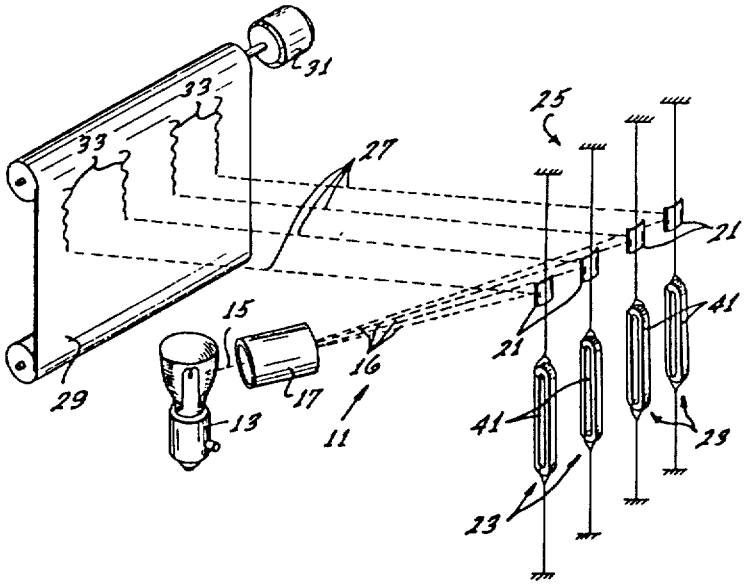
Fig. 1
Fig. 2
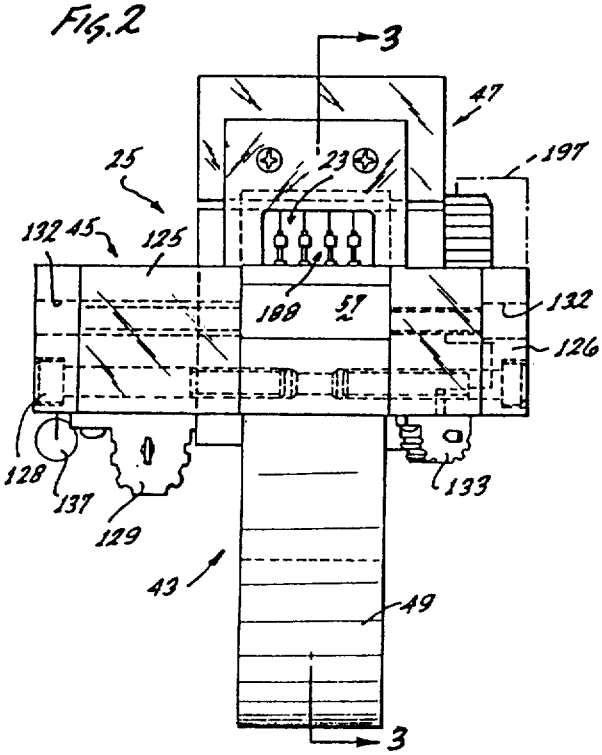
Fig. 7
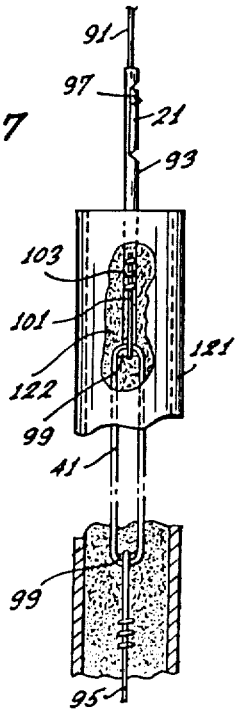

LIGHT DEFLECTION APPARATUS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates generally to light deflection mechanisms and more specifically to galvanometers of the type used in an oscillograph for providing a permanent record of a plurality of energizing signals introduced to the galvanometers.

2. Description of the Prior Art

An oscillograph is an instrument having a light source providing a beam of light and a photosensitive paper movable in the path of the beam of light and having photosensitive properties responsive to the beam of light to provide a trace on the paper. A galvanometer assembly, positioned between the light source and the photosensitive paper in the path of the beam of light, includes a mirror which deflects the beam of light in a direction transverse to the movement of the paper. The deflection of the mirror is in accordance with the characteristics of an energizing signal introduced to the galvanometer. Thus the greater the magnitude of the signal, the greater the deflection of the light beam. As the light beam is deflected, it provides the trace on the photosensitive paper with characteristics representative of the characteristics of the energizing signal.

The galvanometer assembly typically includes a coil which is suspended with the mirror between a pair of wires. The coil is positioned within an air gap defined by pole pieces attached to a large permanent magnet. The coil is energized through the suspending wires by the energizing signal to be recorded. This signal produces an electromagnetic effect in the coil which aids or opposes the magnetic field produced by the permanent magnet to deflect the coil and the attached mirror. A galvanometer assembly of this type is disclosed and claimed by Richardson in his U.S. Pat. No. [3,599,611,] *2,599,661* assigned of record to the assignee of record of the present application.

In the past, each of the galvanometers have been separately constructed and encased. Each galvanometer has been provided with its own secondary pole pieces which have registered with grooves in a pair of primary pole pieces associated with the permanent magnet. As a result of this individual construction, the cost per channel of the galvanometer assembly has been relatively high. In addition, each of the galvanometers has been separately mounted so that any alignment of the galvanometers with respect to each other has been carried out by the user rather than the manufacturer. In some cases, the coils associated with the galvanometers have been mounted in tubes filled with oil. In this configuration, the oil has tended to damp any undesirable oscillations of the coil and mirror. A heater assembly has been used to maintain the temperature of the oil so that its viscosity tends to remain substantially constant.

Although these oscillographs and galvanometer assemblies have provided excellent means for recording signals, it is always desirable to minimize the cost per channel. In addition, it may be desirable to provide means for simultaneously aligning all of the galvanometers in a single oscillograph.

SUMMARY OF THE INVENTION

In accordance with the present invention, a galvanometer assembly is provided which is particularly adapted for modular construction. This particular assembly includes more than one galvanometer, and in fact may include any number of galvanometers depending on the intended use of the assembly. In addition to providing a cost per channel which is reduced by as much as 50%, this assembly provides a single multichannel module which can be prealigned at the factory. In addition, the module can be mounted in an oscillograph in a manner providing for the simultaneous alignment of the channels in the assembly. The modular construction also makes it relatively easy to maintain the ambient temperature of the galvanometers. Furthermore, common pole pieces provide substantially the same flux per channel so that the channels have similar performance characteristics.

Each of the galvanometer channels is provided with a coil and a mirror which are suspended between wires supported by a structure including a top fixture number and a bottom fixture member. These fixture members are maintained in a fixed, spaced relationship by rod members which extend through the fixture members. Pointed set screws in the fixture members register with aperatures in the rod members to provide for self-alignment of the supporting structure.

A pair of secondary pole pieces are provided on opposite sides of the coils in the galvanometers. Each of the pole pieces is separately attached to the rod members and includes a plurality of teeth each of which extends into proximity with an associated one of the coils. With the provision of pole pieces which are common to all of the galvanometers, the flux per channel is maintained substantially constant so that the deflection characteristics of the individual channels are similar.

It has also been found particularly advantageous that the galvanometers can all be encased in a single enclosure. This facilitates maintenance of the ambient temperature of the galvanometers at a substantially constant level to minimize any differences in performance characteristics which might otherwise result.

These and other features and advantages of the invention will be more apparent with a description of preferred embodiments and a discussion of the associated drawings.

DESCRIPTION OF THE DRAWINGS

FIG. 1 is a schematic perspective view of an oscillograph including a plurality of galvanometers each responsive to a different energizing signal to provide an associated trace on a photosensitive medium;

FIG. 2 is a front elevational view of one form of a galvanometer assembly of the present invention illustrating a galvanometer module, an associated permanent magnet assembly, and a heater assembly;

FIG. 7 is an enlarged side elevational view partially in section of one of the galvanometers associated with the module illustrated in FIG. 5;

DESCRIPTION OF PREFERRED EMBODIMENTS

Figures 3, 5, 6:
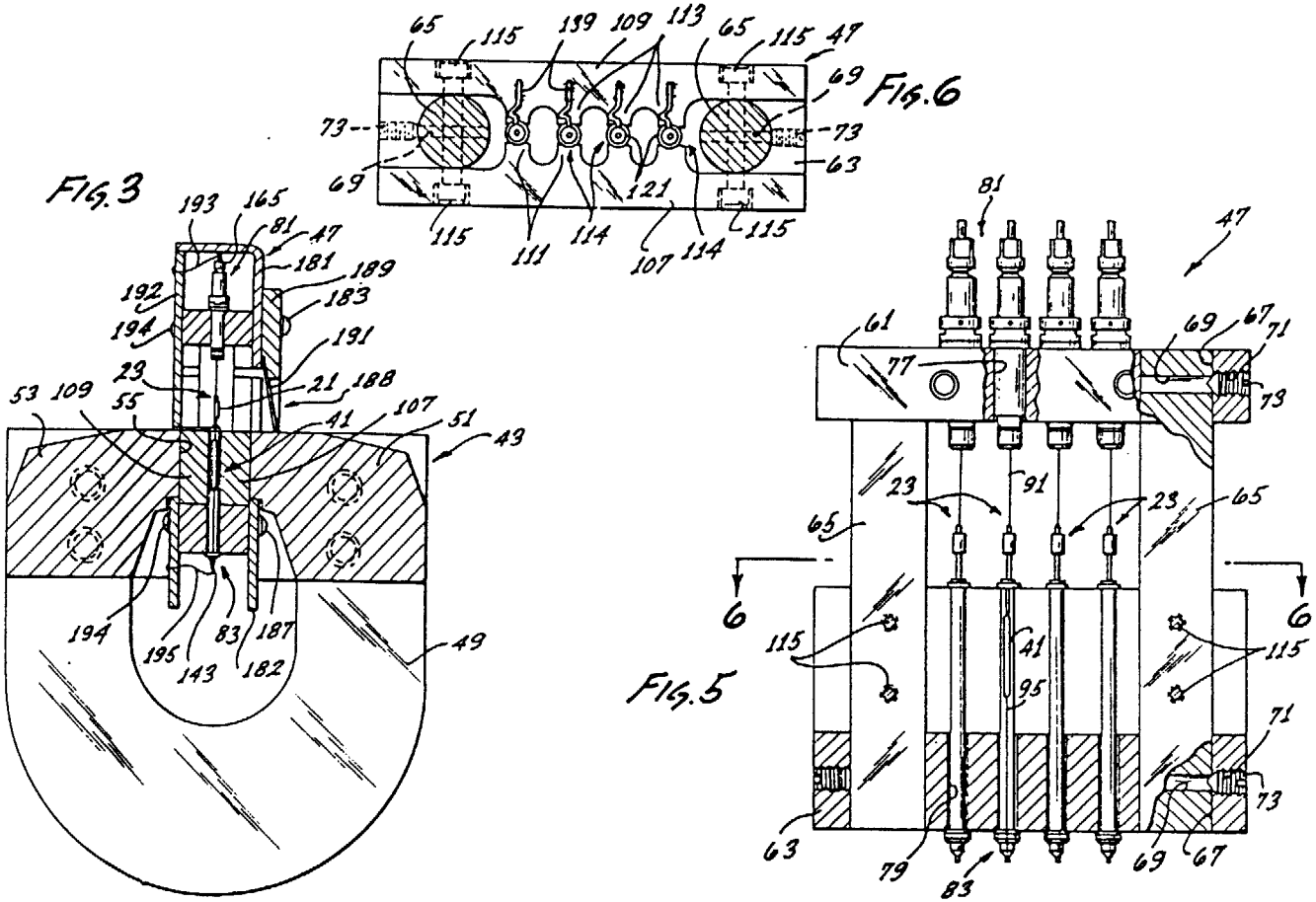
FIG. 3 cross sectional elevational view of the galvanometer assembly taken along lines 3—3 of FIG. 2.
FIG. 5 is a front elevational view partially in section of one form of a preferred embodiment of the galvanometer module of the present invention.
FIG. 6 is a cross sectional view of the galvanometer module taken along lines 6—6 of FIG. 5.

A recording oscillograph is an instrument which deflects a light beam in accordance with the characteristics of a signal and then records the deflections of the light beam. Usually there will be several signals each deflecting an associated light beam in a multi-channel instrument. Such an oscillograph is illustrated schematically in FIG. 1 and designated generally by the reference numeral 11. The oscillograph 11 includes a light source such as an argon or xenon lamp 13 which provides a beam of light 15. The oscillograph 11 may include a series of lenses collectively referred to as a window 17 for shaping the beam of light 15 in order to provide an incident light beam 16.

This incident light beam 16 is directed onto a light deflection mechanism such as a galvanometer assembly designated by the reference numeral 25. In the galvanometer assembly 25, a plurality of galvanometers 23 each includes a mirror 21 which is positioned in the path of the incident light beam 16. When the incident light beam 16 strikes the mirrors 21, a plurality of reflected light beams 27 are produced, one for each of the galvanometers 23.

These reflected light beams 27 are projected onto a photosensitive medium, such as a photosensitive paper 29. The paper 29, which is typically moved at a constant rate of speed by a motor 31, has photosensitive properties so that each of the reflected light beams 27 produces a trace 33 on the paper 29.

Each of the galvanometers 23 is responsive to an associated signal to be recorded to rotate the associated mirrors 21 slightly. Of course this produces a corresponding movement of the associated reflective light beam 27 with respect to the paper 29. The degree of movement is dependent upon the magnitude of the signal to be recorded so that the resulting trace 33 provides an indication of the characteristics of the recorded signal.

Each of the galvanometers 23 includes a coil 41 which is connected to an associated one of the mirrors 21 and disposed in a substantially constant magnetic field. The signal to be recorded is introduced to this coil 41 and the resulting electromagnetic effect either aids or opposes the constant magnetic field to provide a corresponding rotation of the coil 41. This rotation is transferred to the associated mirror 21 to provide the desired deflection of the associated reflected light beam 27.

Figure 4:
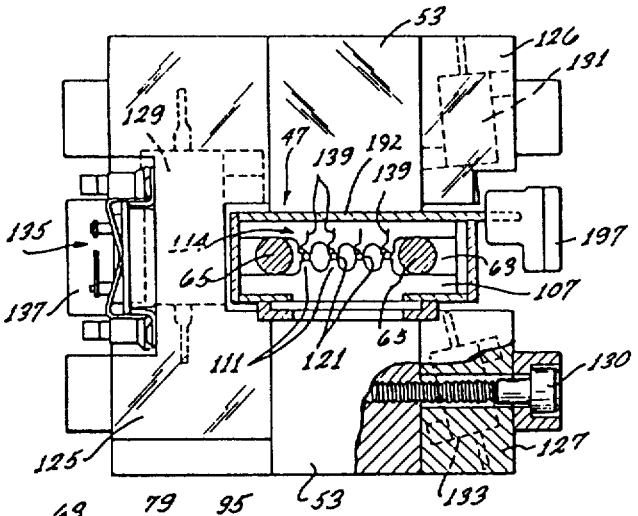
FIG. 4 is a top plan view of the galvanometer assembly illustrated in FIG. 2.

This function can be more easily understood by referring to an embodiment of one form of the galvanometer assembly 25 of the present invention as illustrated in FIGS. 2, 3 and 4. This galvanometer assembly 25 comprises a permanent magnet assembly 43, a heater assembly 45, and a galvanometer module 47 which includes the galvanometers 23.

The permanent magnet assembly 43 includes a bipolar permanent magnet 49 preferably having a horseshoe configuration. Each of the poles of the permanent magnet 49 is provided with a primary pole piece 51, 53 best illustrated in FIG. 3. These primary pole pieces 51 and 53 are directed toward each other to produce a primary air gap 55 within which the galvanometer module 47 is positioned to provide the substantially constant magnetic field in proximity to the galvanometers 23.

The permanent magnet 49 can be made from any suitable material such as Alnico-5 which is commonly available from many magnetic material suppliers such as Arnold Engineering Company of Marengo, Illinois. In a preferred embodiment, the material of the primary pole pieces 51 and 53 is a low carbon, free machining steel.

The galvanometer module 47 is separately illustrated in FIGS. 5 and 6. Although the module 47 is illustrated to include four of the galvanometers 23, it will be understood that it may include any number of galvanometers, but preferably more than one in order to achieve the advantage of a reduced cost per channel.

The galvanometers 23 are supported by a structure including a top fixture member 61 and a bottom fixture member 63 which are maintained in a spaced, fixed relationship by a pair of rod members 65. The rod members 65, which may have a parallel relationship, are preferably spaced apart to provide the supporting structure with a generally rigid configuration. In a preferred embodiment, the top and bottom fixture members 61 and 63, [respectfully] *respectively*, are formed from non-magnetic metal and are drilled to produce rod holes 67 of a diameter suitable to accept the rod members 65.

The rod members 65, which may also be formed from non-magnetic metal, can be drilled to produce alignment holes 69. When the rod members 65 are operatively positioned with respect to the fixture members 61 and 63, the alignment holes 69 preferably extend within and laterally of the associated rod holes 67.

At a corresponding position in the top and bottom fixture members 61 and 63 respectively, set screw holes 71 can be provided to extend laterally of the rod hole 67. Each of the screw holes 71 can be suitably threaded to receive a pointed set screw 73 which registers with the associated alignment hole 69 in the associated rod member 65 to automatically align the supporting structure.

The resulting configuration for the supporting structure is particularly desirable. It provides a structure which is quite rigid and yet easy to assemble and align. The rigidity is particularly desirable in order to provide the galvanometers 23 with a solid basis for support. The structure is particularly easy to assemble and align. By merely inserting the rod member 65 into the associated rod hole 67 and tightening the associated set screw 73, the rod members 65 are automatically positioned with respect to the top and bottom fixture members 61 and 63 respectively. This particular structure with its ease of assembly and self-aligning characteristics significantly reduces the cost per channel of the module 47.

A preferred embodiment of one form of the galvanometers 23 is best illustrated in the assembly in FIG. 3, in the module in FIG. 5, and separately in FIG. 7. With particular reference to FIG. 5, it can be seen that each of the galvanometers 23 is associated with one of a plurality of holes 77 in the top fixture member 61 and one of a plurality of holes 79 in the bottom fixture member 63. In a preferred embodiment, each of the holes 77 is coaxially aligned with an associated one of the holes 79.

Generally speaking, each of the galvanometers 23 comprises a suspension which is supported under tension between an upper terminal assembly 81 and a lower terminal assembly 83. The upper terminal assembly 81 is disposed on the side of the associated hole 77 opposite the associated galvanometer 23 but is sufficiently large to avoid being pulled through the hole 77. Similarly, the lower terminal assembly 83, which is disposed on the side of the lower fixture member 63 opposite the galvanometer 23, is larger than the associated hole 79.

In a preferred embodiment, the suspension associated with each of the galvanometers 23 includes an upper wire 91 which is electrically connected to a tube 93 (FIG. 7) which is in turn electrically connected to one end of the associated coil 41. The opposite end of the coil 41 is electrically connected to a bottom wire 95 which is electrically terminated at the lower terminal assembly 83. In a preferred embodiment, the tube 93 is adapted to receive the upper wire 91 along the axis of the tube 93 at which point it can be soldered to provide structural and electrical support. The tube 93 can be axially slotted to produce a groove 97 having an increased surface area for receiving the associated mirror 21. The mirror 21 can be glued in this position as illustrated in FIG. 7.

The coil 41, which comprises many turns of fine wire, can be wound around a pair of spaced apart sapphire jewels 99 to provide the coil 41 with a longitudinal configuration and circular cross section. In the embodiment of FIG. 7, a stirrup ribbon 101 is threaded around one of the jewels 99 and through the coil 41 at the upper end thereof. The ends of the ribbon 101 are positioned along either side of tube 93 at the lower end thereof. The stirrup ribbon 101 together with one end of the wire from the coil 41, are physically bound to the lower end of the tube 93 by a wrapping wire 103. This junction is preferably soldered to provide physical and electrical continuity between the tube 93 and the coil 41. The opposite end of the coil can be similarly electrically and structurally attached to the lower wire 95.

As best illustrated in FIG. 3 the galvanometer module 47 is positioned so that the coils 41, which are preferably in planar alignment in the module 47, are disposed within the primary air gap 55 formed between the primary pole pieces 51 and 53. In this location, the coils 41 are subjected to a substantially constant magnetic field produced by the permanent magnet assembly 43. The signal to be recorded can then be introduced across the upper and lower terminal assemblies 81 and 83 to energize the associated coil 41. Thus energized, the coil will produce its own magnetic field which either aids or opposes the constant magnetic field associated with the permanent magnet assembly 43. Since the electromagnetic field associated with the coil 41 will have a magnitude dependent upon the magnitude of the signal to be recorded, the coil 41 will tend to rotate about its longitudinal axis in accordance with the magnitude of the energizing signal. This rotation will be transferred through the tube 93 to the mirror 21 which will provide a corresponding deflection in the associated reflected beam 27.

In order to concentrate the flux associated with the magnetic field of the permanent magnet assembly 43, a pair of secondary pole pieces 107 and 109, best illustrated in FIG. 6, are provided in a preferred embodiment. The secondary pole pieces 107 and 109 are preferably in surface contact with the pole pieces 51 and 53 respectively to receive the magnetic flux associated with the permanent magnet assembly 43.

This flux is concentrated into a plurality of teeth 111 in the secondary pole piece 107 and a plurality of teeth 113 in the secondary pole piece 109. One of the teeth 111 and one of the teeth 113 are associated with each of the galvanometers 23. These teeth 111 and 113 have a generally longitudinal configuration and extend laterally of the respective secondary pole piece 107 and 109 substantially parallel to and in proximity with the associated coil 41. Thus the teeth 111 and 113 associated with the coils 41 face each other on opposite sides of the coils 41 to produce a plurality of secondary air gaps 114 within each of which an associated one of the coils 41 is positioned.

In a preferred embodiment, the secondary pole pieces 107 and 109 are attached to the rod members 65 by a plurality of screws 115 which extend into threaded holes in the rod members 65. The secondary pole pieces can be formed from any low carbon, free machining steel.

As the signal to be recorded is applied to the associated coil 41, the rotational movement of the coil 41 is opposed by the tortional resistance of the wires 91 and 95. Thus, the suspension will follow the single degree of freedom phenomenon well known to those skilled in the art. For this reason, damping may be desired in order to obtain usable results over a wide range of operating frequencies. In a preferred embodiment, damping is provided for each of the galvanometers 23 by a fluid filled tube 121 which extends around the associated coil 41. The fluid can be any non-volatile liquid, such as oil 122, having a viscosity which opposes the movement of the coil 41.

The tubes 121 are preferably aligned coaxially with the suspension forming the associated galvanometer 23. One means of maintaining this alignment comprises a plurality of centering guides or wires 139 which can be attached to the pole piece 109 to extend across an associated one of the secondary air gaps 114 formed between the opposing teeth 111 and 113. The wires 139 are preferably attached to the pole piece 109 by an adhesive or glue. As illustrated in the embodiment of FIG. 6, the wires 139 can be wrapped around the upper end of the associated tube 121 to maintain its coaxial alignment with the associated coil 41 of the associated galvanometer 23.

The amount of damping provided by the fluid filled tubes 121 is dependent upon the viscosity of the oil 122. Since this viscosity changes with temperature, it may be desirable in some applications to maintain the environment of the galvanometers 23 at a substantial constant temperature. This is a main purpose of the heater assembly 45 which is best illustrated in FIGS. 2 and 4.

The heater assembly 45 in the illustrated embodiment includes three heater blocks 125, 126, and 127. The heater block 125 can be attached to the primary pole pieces 51 and 53 by a plurality of screws 128. Similarly, the heater blocks 126 and 127 can be attached to the primary pole pieces 51 and 53 by a plurality of screws 130. Holes 132 can be drilled and threaded in each of the heater block members 125, 126 and 127 to provide means for mounting the galvanometer assembly 25 in the oscillograph 11.

Figure 8:
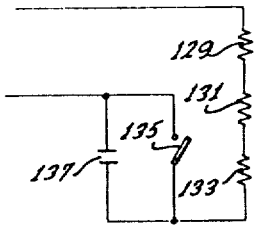
FIG. 8 is a schematic diagram of the heater assembly illustrated in FIG. 2.

The blocks 125, 126 and 127 can be electrically heated by a circuit illustrated in FIG. 8 the elements of which are shown best in FIGS. 2 and 4. The primary heating elements in this circuit include resistors 129, 131 and 133 which are serially connected and energized with the closing of a thermostat 135. A capacitor 137 can be connected in parallel with the thermostat 135, to provide means for inhibiting any burning of the contacts associated with the thermostat 135. The resistor 129, which may be 250 ohms and 25 watts, can be attached to the block 125 along with the capacitor 137 and the thermostat 135. The resistors 131 and 133, which may each be 50 ohm and 5 watts, each can be attached to the respective blocks 126 and 127.

Figure 9:
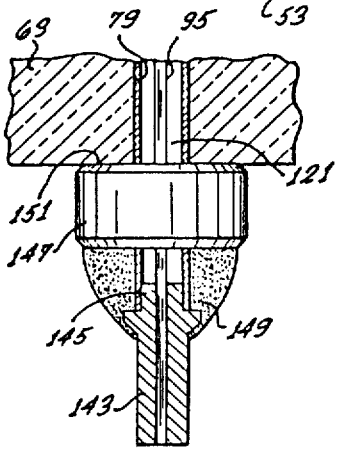
FIG. 9 is an axial cross sectional view of a bottom terminal assembly associated with the galvanometer illustrated in FIG. 7.

The bottom terminal assembly 83, illustrated generally in FIGS. 3 and 5 and in greater detail in FIG. 9, has at least two purposes. It provides an electrical terminal for the wire 95 which energizes the coil 41, and it provides a structural terminal for opposing the tension on the suspension. In a preferred embodiment illustrated in FIG. 9, a metal terminal 143 is soldered to the wire 95. This terminal 143 is provided with a plug 145 which can be seated in the bottom of the associated tube 121. A flange 147 can be attached to the tube 121 and the terminal 143 by a suitable adhesive such as resin 149. The flange 147 provides a shoulder 151 which is positioned against the lower fixture member 63 but has a diameter greater than that of the associated hole 79 so that it opposes the tension on the suspension. Since the tube 121 extends through the entire hole 79 in the illustrated embodiment, the wire 95 and terminal 143 are insulated from the lower fixture member 63.

Figure 10:
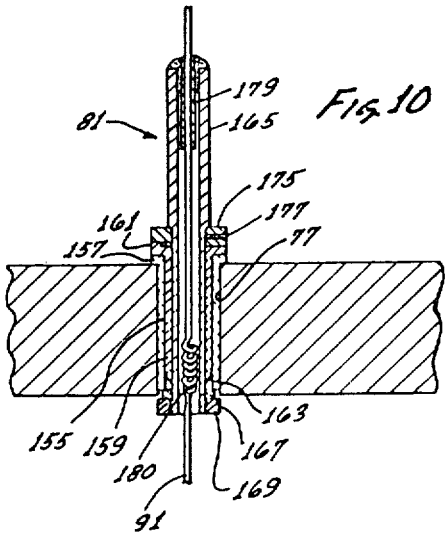
FIG. 10 is an axial cross sectional view of a top terminal assembly associated with the galvanometer illustrated in FIG. 7.
Figure 11:
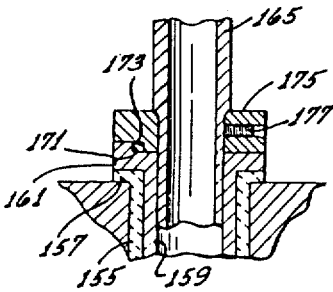
FIG. 11 is an enlarged axial cross sectional view of a portion of the top terminal assembly illustrated in FIG. 10.

The upper terminal assembly 81 is best illustrated in FIGS. 10 and 11. The upper terminal assembly 81 provides means for opposing the tension on the suspension, means for insulating the wire 91 from the top fixture member 61, and means for rotationally aligning the suspension.

The assembly 81 includes a sleeve 155 which has insulating properties and is glued within an associated one of the holes 77 in the top fixture member 61. The sleeve 155 is provided with a flange 157 which is positioned on the side of the top fixture member 61 opposite the mirror 21 and coil 41. The flange 157 has a diameter greater than that of the hole 77 so that it is incapable of moving through the hole 77.

A sleeve 159 is positioned within the sleeve 155 and has a shoulder 161 which is glued to the flange 157 on the sleeve 155. At the opposite end of the sleeve 159, a plurality of friction fingers 163 engage a metal terminal 165 which extends entirely through the sleeve 159. The friction fingers 163 aid in centering the metal terminal 165 but do not inhibit rotation of the terminal 165 relative to the sleeve 159. The terminal 165 can have a cylindrical configuration and can be threaded at the lower end thereof as illustrated in FIG. 10. A washer 167, preferably having a diameter greater than that of the sleeve 159 but less than that of the sleeve 155 is positioned over the threaded end of the terminal 165. A nut 169 holds the washer 167 in place and inhibits the upperward movement of the terminal 165 with respect to the sleeves 155 and 159.

An enlarged FIG. 11 illustrates that the flange 161 associated with the sleeve 159 can be provided with an upwardly extending shoulder 171 which cooperates with a downwardly extending shoulder 173 on a stopping flange 175. The flange 175 can be fixed to the terminal 165 by a set screw 177.

The shoulders 171 and 173 permit rotation of flange 175 relative to the flange 161 over a predetermined angular displacement. The extent of the angular displacement, which in a preferred embodiment is 45°, is dependent upon the placement of the shoulders 171 and 173. Since the flange 175 has a fixed relationship to the wire 91 and the flange 161 has a fixed relationship to the top fixture member 61, this rotation permits alignment of the mirror 21 with respect to the supporting structure.

When the galvanometers 23 are first constructed, tension can be applied to the assembly by drawing the wire 91 through a small tube 179 which is soldered to the upper end of the wire 91 as shown in FIG. 10. A desired tension can be applied to the tube 179 and hence to the wire 91 as the tube 179 is soldered to the terminal 165. This tension on the wire 91 can be maintained by coiling the wire 91 to form a spring 180. The tension on the wire 91 is opposed by the stopping flange 175 which is fixed to the terminal 165 and therefore inhibits its downward movement in FIG. 9.

In a preferred embodiment, the galvanometer module 47 has an enclosure which provides dust protection for the galvanometers 23. An upper enclosure member 181, and a lower enclosure member 182, best illustrated in FIG. 3, extend over the top, the sides, and a substantial portion of the front of the galvanometers 23 and supporting structure. The upper enclosure member 181 can be fixed to the supporting structure by a plurality of screws 183 which extend into threaded holes in the upper fixture member 61. Similarly, screws 187 can be provided to fix the lower enclosure member 182 to the lower fixture member 63.

The enclosure members 181 and 182 define a window 188 at the front of the module 47, as shown in FIG. 2. A bezel 189, which can be held in place by the screws 183, supports a transparent pane 191 over this window 188. In a preferred embodiment, both the incident and reflected beams of light 19 and 27, respectively, pass through the pane 191 to the mirrors 21.

The pane 191 is preferably disposed at an angle such as 6° with respect to the beams of light 16 and 27 so that any ghosts associated with the beams are cast away from the photosensitive paper 29. This feature can be further enhanced by the provision of an anti-glare coating on the pane 191.

Although the enclosure members 181 and 182 can be formed as a single element, the bifurcated construction may be preferred since it permits access to the galvanometers 23 with removal of only a small portion of the enclosure. For example, the ease with which the top enclosure member 181 can be removed with be particularly appreciated if the damping fluid such as the oil 122, is to be changed.

The enclosure associated with the module 47 can be completed by a printed circuit board 192 which cooperates with the enclosure members 181 and 182 to substantially enclose the galvanometers 23 and supporting structure. The circuit board 192 can be held in place along the back of the module 47 by a plurality of screws 194 which extend into the upper and lower fixture members 61 and 63 respectively. A pair of wires 193 and 195 can be used to connect the terminals 165 and 143 respectively to the circuit board 192. The circuit board 192 preferably extends beyond the side of the enclosure members 181 and 182 to facilitate its registration with a terminal strip 197, best shown in FIG. 4.

From the foregoing discussion it is apparent that the galvanometer assembly of the present invention offers many significant advantages. First, it lends itself readily to use in an oscillograph having modular construction. With the provision of several of the galvonometers 23 in a single module 47 the cost per channel of the assembly 25 is greatly reduced, for example, by as much as 50 percent. The modular construction also makes it possible to align the galvanometers 23, both individually and with respect to each other, at the factory.

A single enclosure for several of the galvanometers 23 makes it possible to provide a single pane 191 which is relatively large in size and therefore easier to clean.

With the provision of only a single pair of secondary pole tips 107, 109, the flux per channel is substantially constant. This flux is concentrated in proximity to the coils 41 by the teeth 111 and 113.

Although the invention has been described with reference to specific embodiments, it will be understood that it can be otherwise embodied so that the scope of the invention should be ascertained only in reference to the following claims.

We claim:

1. A light deflection mechanism responsive to a plurality of energizing signals to provide on display means a plurality of traces each representative to the characteristics of an associated one of the energizing signals, the mechanism comprising:

a first structural member having portions defining a plurality of first apertures;

a second structural member disposed relative to the first structural member and having portions defining a plurality of second apertures each extending in alignment with an associated one of the first apertures in the first structural member;

means for maintaining the first and second structural members in a spaced relationship;

a plurality of light deflectors each extending through an associated one of the first apertures of the first structural member and an associated one of the second apertures in the second structural member;

first means for engaging the light deflectors on the side of the first apertures opposite the light deflectors;

second means for engaging the light deflectors on the side of the second aperture opposite the light deflectors;

the second means cooperating with the first means to provide the deflectors with a tensile stress between the first structural member and the second structural member; and each of the light deflectors including a mirror providing a reflected light beam and a coil responsive to the associated energizing signal to deflect the coil and the mirror so that the reflected light beam provides the associated trace representative of the characteristics of the associated energizing signal.

2. The mechanism set forth in claim 1 wherein the means for maintaining the first structural member and the second structural member in the spaced relationship includes:

a third structural member extending between the first structural member and the second structural member; and a fourth structural member extending between the first structural member and the second structural member in spaced relationship with the third structural member, and;

the fourth structural member cooperating with the third structural member to maintain the first structural member and the second structural member in the spaced relationship.

3. The mechanism recited in claim 2 further comprising:

portions of the first structural member defining a first pair of openings;

portions of the second structural member defining a second pair of openings;

the third structural member having a first end supported in an associated one of the first pair of openings and a second end supported in an associated one of the second pair of openings;

the fourth structural member having a first end supported in the other of the first pair of openings and a second end supported in the other of the second pair of openings;

a plurality of set screws each extending through an associated one of the first and second structural members transversely of the associated third and fourth structural members into an associated one of the first and second pair of openings for engaging the associated third and fourth structural members; whereby the first and second structural members are fixed to the ends of the third and fourth structural members by the set screws to maintain the first and second structural members in the space relationship.

4. The mechanism set forth in claim 3 further comprising:

portions of the third structural member defining a pair of slots separated from each other by a predetermined distance; and the set screws associated with the third structural member extending into the associated first and second openings in the associated first and second structural members and into the associated slots in the third structural member to maintain the first and second structural members in a relationship spaced by a distance dependent upon the predetermined distance.

5. The light deflection mechanism recited in claim 1 further comprising:

enclosure means forming a single cavity and a plurality of light deflectors being at least partially disposed within the single cavity of the enclosure means; and means for attaching the enclosure means to at least one of the first and second structural members and the means for maintaining the first and second structural members in a spaced relationship.

6. The light deflection mechanism recited in claim 5 wherein the enclosure means includes a single windowpane through which the light passes to and from the plurality of light deflectors.

[7. A galvanometer assembly adapted for use with a magnet in deflecting a light beam in accordance with the characteristics of a plurality of signals to record the signals on a photosensitive medium, including:

a plurality of suspension galvanometers each having an electrical coil adapted to receive an associated one of the signals and a mirror disposed in the path of the light beam and movable with the associated coil to deflect the light beam in response to the characteristics of the associated signal;

supporting structure means for suspending the plurality galvanometers with the coils of the galvanometers disposed in substantially planar alignment;

flux concentration means associated with the magnet and having a plurality of teeth for concentrating the magnetic flux of the magnet in proximity to the coils of the galvanometers; and means for attaching the flux concentration means to the supporting structure.]

8. The galvanometer assembly recited in claim [7] *10* wherein the flux concentration means includes:

a first pole piece associated with the magnet and having a plurality of first teeth each extending into proximity to an associated one of the coils of an associated one of the galvanometers, the first teeth being disposed in substantial alignment along one side of the galvanometers; and a second pole piece associated with the magnet and having a plurality of second teeth each extending into proximity to an associated one of the coils of an associated one of the galvanometers, the second teeth being disposed in substantial alignment along the side of the galvanometers opposite the first teeth.

9. [The galvanometer assembly recited in claim 7 wherein the supporting structure includes:

a top fixture member;] *A galvanometer assembly adapted for use with a magnet in deflecting a light beam in accordance with the characteristics of a plurality of signals to record the signals on a photosensitive medium, including:*

*a plurality of suspension galvanometers each having an electrical coil adapted to receive an associated one of the signals and a mirror disposed in the path of the light beam and movable with the associated coil to deflect the light beam in response to the characteristics of the associated signal;*

*supporting structure means for suspending the plurality galvanometers with the coils of the galvanometers disposed in substantially planar alignment;*

*flux concentration means associated with the magnet and having a plurality of teeth for concentrating the magnetic flux of the magnet in proximity to the coils of the galvanometers; and*

*means for attaching the flux concentration means to the supporting structure;*

*said supporting structure means including* a bottom fixture member disposed in space relationship to the top fixture member;

[rod] means for maintaining the top fixture member and the bottom fixture member in spaced relationship; and means for suspending the plurality of galvanometers between the top fixture member and the bottom fixture member.

10. [The galvanometer assembly recited in claim 7 further comprising:] *A galvanometer assembly adapted for use with a magnet in deflecting a light beam in accordance with the characteristics of a plurality of signals to record the signals on a photosensitive medium, including:*

*a plurality of suspension galvanometers each having an electrical coil adapted to receive an associated one of the signals and a mirror disposed in the path of the light beam and movable with the associated coil to deflect the light beam in response to the characteristics of the associated signal;*

*supporting structure means for the plurality of galvanometers, said supporting structure means including a top fixture member and means for suspending the plurality of galvanometers from said top fixture member, with the coils of the galvanometers disposed in substantially planar alignment;*

*flux concentration means associated with the magnet and having a plurality of teeth for concentrating the magnetic flux of the magnet in proximity to the coils of the galvanometers;*

*means for attaching the flux concentration means to the supporting structure;* a window pane having a planar configuration and being disposed in the path of the light beam; and bezel means for supporting the window pane in a fixed relationship with the supporting structure with the plane of the window pane having an angular relationship with the beam of light passing through the window pane so as to cast any ghosts associated with the beam of light away from the galvanometers.

11. [The galvanometer assembly recited in claim 7, further comprising;] *A glavanometer assembly adapted for use with a magnet in deflecting a light beam in accordance with the charateristics of a plurality of signals to record the signals on a photosensitive medium, including:*

*a plurality of suspension galvanometers each having an electrical coil adapted to receive an associated one of the signals and a mirror disposed in the path of the light beam and movable with the associated coil to deflect the light beam in response to the characteristics of the associated signal;*

*supporting structure means for the plurality of galvanometers, said supporting structure means including a top fixture member and means for suspending the plurality of galvanometers from said top fixture member, with the coils of the galvanometers disposed in substantially planar alignment;*

*flux concentration means associated with the magnet and having a plurality of teeth for concentrating the magnetic flux of the magnet in proximity to the coils of the galvanometers;*

*means for attaching the flux concentration means to the supporting structure;* terminal means included in the galvanometers for introducing the signals to the coils of the galvanometers;

a circuit board attached to the supporting structure for introducing the signals to the terminal means; and enclosure means formed in part by the circuit board for enclosing at least the galvanometers to provide dust protection for the galvanometers.

12. A galvanometer module adapted for use with a magnet for deflecting a light beam in accordance with the characteristics of a plurality of signals to record the signals on a display medium, including:

a supporting structure;

a first galvanometer coupled to the supporting structure having a first electrical coil adapted to receive a first one of the signals and a first mirror coupled to the first coil and deflectible with the first coil in response to the characteristics of the first signal, the first mirror being disposed in the path of the light beam and deflecting the light beam in accordance with the characteristics of the first signal;

a second galvanometer coupled to the supporting structure and having a second electrical coil adapted to receive a second one of the signals and a second mirror coupled to the second coil and deflectible with the second coil in response to the characteristics of the second signal, the second mirror being disposed in the path of the light beam and deflecting the light beam in accordance with the characteristics of the second signal;

the first galvanometer and the second galvanometer having a generally longitudinal configuration and being disposed in a relatively planar relationship;

a single enclosure coupled to the supporting structure and defining a single cavity substantially enclosing the first galvanometer and the second galvanometer; whereby the light beam directed onto the first mirror and the second mirror is deflected to provide on the display medium a display of the characteristics of the respective first signal and second signal[.];

*said supporting structure including:*

*a top fixture member;*

*a bottom fixture member;*

*means for maintaining said top and bottom fixture members in a spaced relationship; and*

*means for suspending the first galvanometer and the second galvanometer each between the top fixture member and the bottom fixture member.*

[13. The galvanometer module recited in claim 12 wherein the supporting structure includes:

a first fixture member;

a second fixture member;

means for maintaining the first fixture member and the second fixture member in a spaced relationship; and the first galvanometer and the second galvanometer each being suspended between the first fixture member and the second fixture member.]

14. The galvanometer module set forth in claim 12 wherein the enclosure of the module is coupled to the supporting structure and substantially encloses the supporting structure as well as the first and second galvanometers.

15. [The galvanometer module set forth in claim 12 wherein the enclosure includes:] *A galvanometer module adapted for use with a magnet for deflecting a light beam in accordance with the characteristics of a plurality of signals to record the signals on a display medium, including:*

*a supporting structure;*

*a first galvanometer coupled to the supporting structure having a first electrical coil adapted to receive a first one of the signals and a first mirror coupled to the first coil and deflectible with the first coil in response to the characteristics of the first signal, the first mirror being disposed in the path of the light beam and deflecting the light beam in accordance with the characteristics of the second signal;*

*the first galvanometer and the second galvanometer having a generally longitudinal configuration and being disposed in a relatively planar relationship;*

*a single enclosure coupled to the supporting structure and defining a single cavity substantially enclosing the first galvanometer and the second galvanometer; whereby*

*the light beam directed onto the first mirror and the second mirror is deflected to provide on the display medium a display of the characteristics of the respective first signal and second signal;*

*said enclosure including:* a first enclosure member having a fixed relationship with the supporting structure, the first enclosure member being removable from the supporting structure to provide access to the first and second galvanometers;

a second enclosure member having a fixed relationship with the supporting structure and defining with the first enclosure member a window; and a single window pane having an inclined relationship with respect to the plane of the first galvanometer and the second galvanometer; and the light beam passing to and from the first and second mirrors through the window pane.

[16. A galvanometer assembly adapted for use with a bipolar magnet in deflecting a light beam in accordance with the charateristics of a plurality of signals to record the signals on a photosensitive medium, including:

a plurality of suspension galvanometers each having an electrical coil adapted to receive an associated one of the signals and a mirror disposed in the path of the light beam and movable with the associated coil to deflect the light beam in response to the characteristics of the associated signal;

supporting structure means for suspending the plurality of galvanometers with the coils of the galvanometers disposed in substantially planar alignment;

a first pair of pole pieces disposed in contiguous relationship with the poles of the magnet and defining a primary air gap;

a second pair of pole pieces disposed in contiguous relationship with the first pair of pole pieces in the primary air gap, each of the second pole pieces forming a plurality of teeth, each of the teeth in one of the second pole pieces being disposed in opposing relationship to an associated one of the teeth in the other of the second pole pieces to form one of a plurality of opposing tooth pairs each defining a secondary air gap; and each of the galvanometers being associated with one of the opposing tooth pairs with the coil of the associated galvanometer being disposed in the associated secondary air gap.]

17. The galvanometer assembly recited in claim [16] *20* further comprising:

a plurality of tubular members each mounted in a fixed relationship to the supporting structure with an associated one of the coils disposed within an associated one of the tubular member in a noncontiguous relationship with the associated tubular member; and a liquid disposed within at least one of the tubular members in contiguous relationship with the associated coil, the liquid having a viscosity for damping movement of the associated coil.

18. The galvanometer assembly recited in claim 17 further comprising:

a plurality of centering wires each adhered to one of the second pole pieces and extending into contiguous relationship with an associated one of the tubular members for supporting the associated tubular member in the noncontiguous relationship with the associated coil.

[19. The galvanometer assembly recited in claim 14 further comprising:

enclosure means forming a single cavity and the purality of suspension galvanometers being at least partially disposed within the single cavity of the enclosure means; and means for attaching the enclosure means to the supporting structure means.]

20. [The galvanometer assembly recited in claim 19 wherein the] *A galvanometer assembly adapted for use with a bipolar magnet in deflecting a light beam in accordance with the characteristics of a plurality of signals to record the signals on a photosensitive medium, including:*

*a plurality of suspension galvanometers each having an electrical coil adapted to receive an associated one of the signals and a mirror disposed in the path of the light beam and movable with the associated coil to deflect the light beam in response to the characteristics of the associated signal;*

*supporting structure means for the plurality of galvanometers, said supporting structure means including a top fixture member and means for suspending the plurality of galvanometers from said top fixture member, with the coils of the galvanometers disposed in substantially planar alignment;*

*a first pair of pole pieces disposed in contiguous relationship with the poles of the magnet and defining a primary air gap;*

*a second pair of pole pieces disposed in contiguous relationship with the first pair of pole pieces in the primary air gap, each of the second pole pieces forming a plurality of teeth, each of the teeth in one of the second pole pieces being disposed in opposing relationship to an associated one of the teeth in the other of the second pole pieces to form one of a plurality of opposing tooth pairs each defining a secondary air gap;*

*each of the galvanometers being associated with one of the opposing tooth pairs with the coil of the associated galvanometer being disposed in the associated secondary air gap;*

*enclosure means forming a single cavity and the plurality of suspension galvanometers being at least partially disposed within the single cavity of the enclosure means; and*

*means for attaching the enclosure means to the supporting structure means; said* enclosure means [includes] *including* a single windowpane through which the light passes to and from the mirrors of the galvanometers.

21. A galvanometer module, including:

a supporting structure including a first [structural] *top fixture* member having a longitudinal configuration, and a [second structural] *bottom fixture* member having a longitudinal configuration and including at least portions thereof disposed in spaced relationship with the [first structural] *top fixture* member;

at least a pair of galvanometers suspended between the [first structural] *top fixture* member and the portions of the [second structural] *bottom fixture* member;

enclosure means coupled to the supporting structure and defining a single cavity; and the galvanometers being at least partially suspended by the supporting structure in the single cavity of the enclosure means.

22. [The galvanometer module of claim 21] *A galvanometer module, including:*

*a supporting structure including a first structural member having a longitudinal configuration, and a second structural member having a longitudinal configuration and including at least portions thereof disposed in spaced relationship with the first structural member;*

*at least a pair of galvanometers suspended between the first structural member and the portions of the second structural member;*

*enclosure means coupled to the supporting structure and defining a single cavity; and*

*the galvanometers being at least partially suspended by the supporting structure in the single cavity of the enclosure means; wherein each of the galvanometers* [includes] *including* a mirror for reflecting a beam of light, and the enclosure means [includes] *including* a single windowpane through which the beam of light is directed onto the mirrors and from which the beam of light is reflected from the mirrors.

* * * * *